(12) United States Patent
Lee et al.

(10) Patent No.: US 7,057,297 B2
(45) Date of Patent: Jun. 6, 2006

(54) TAPE SUBSTRATES WITH MOLD GATE SUPPORT STRUCTURES THAT ARE COPLANAR WITH CONDUCTIVE TRACES THEREOF AND ASSOCIATED METHODS

(75) Inventors: Teck Kheng Lee, Singapore (SG); M Vijendran, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/788,990

(22) Filed: Feb. 27, 2004

(65) Prior Publication Data
US 2005/0051880 A1    Mar. 10, 2005

(30) Foreign Application Priority Data
Sep. 9, 2003    (SG) ................................ 200305841

(51) Int. Cl.
*H01L 23/28*    (2006.01)
(52) U.S. Cl. ........................ 257/787; 257/668
(58) Field of Classification Search .................... None
See application file for complete search history.

(56) References Cited

U.S. PATENT DOCUMENTS

| 5,196,917 | A | * | 3/1993 | Ueda et al. ................. 257/666 |
| 5,750,421 | A | * | 5/1998 | Kasai et al. ................ 438/106 |
| 5,981,873 | A | | 11/1999 | Heo |
| 6,329,606 | B1 | | 12/2001 | Freyman et al. |
| 2002/0180010 | A1 | * | 12/2002 | Tsubosaki et al. .......... 257/667 |

FOREIGN PATENT DOCUMENTS

EP    0 961 317 A2    12/1999

OTHER PUBLICATIONS

Search Report, Mar. 9, 2005, 6 pages.
Patent Abtracts of Japan, JP 03-106045 A, Mitsubishi Electric Corp., May 2, 1991.
Patent Abstracts of Japan, JP 05-211186 A, NEC Corp., Aug. 20, 1993.
Patent Abstracts of Japan, JP 06-151515 A, NEC Corp, May 31, 1994.

* cited by examiner

*Primary Examiner*—Tu-Tu Ho
(74) *Attorney, Agent, or Firm*—TraskBritt, PC

(57) ABSTRACT

A mold gate of a tape substrate includes an aperture formed in the flexible dielectric film of the tape substrate and a support element which is carried by a surface of the flexible dielectric film, is substantially coplanar with conductive traces carried by the flexible dielectric film, and may be formed from the same material as the conductive traces. The aperture of the mold gate may be formed by die cutting or etching processes. The support element of the mold gate may be fabricated by patterning a conductive film and formed at substantially the same time as the conductive traces of the tape substrate are formed. Packaging methods and degating methods that include use of the tape substrate are also within the scope of the present invention.

28 Claims, 6 Drawing Sheets

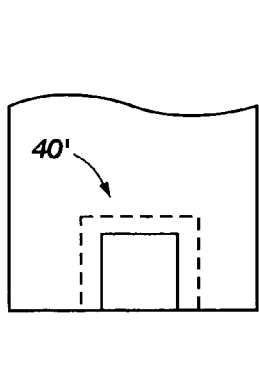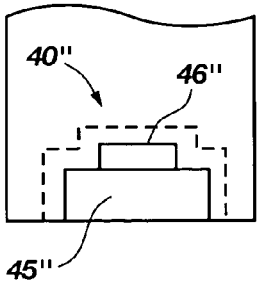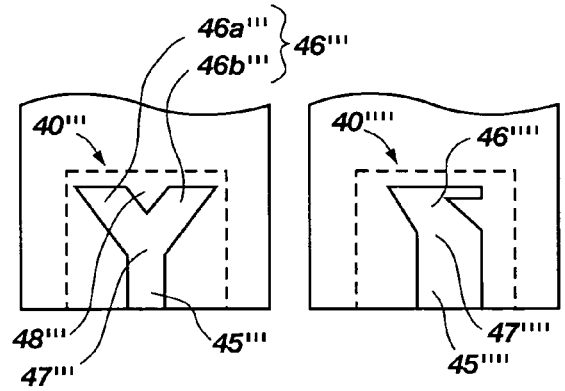
FIG. 4　　FIG. 5　　FIG. 6　　FIG. 7
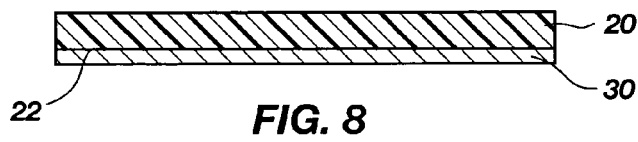
FIG. 8
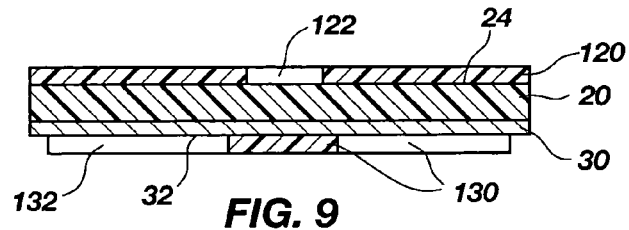
FIG. 9
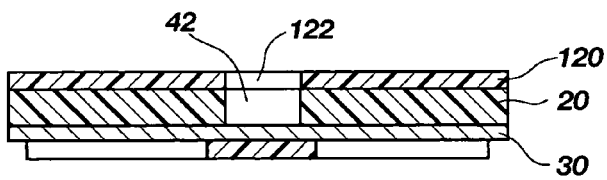
FIG. 10
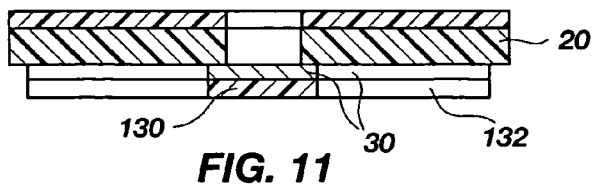
FIG. 11

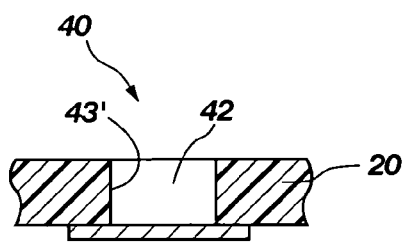
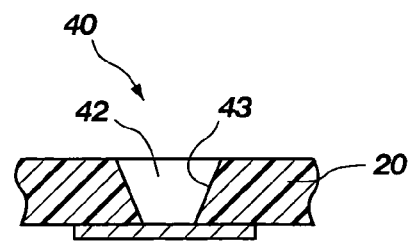
FIG. 20              FIG. 15
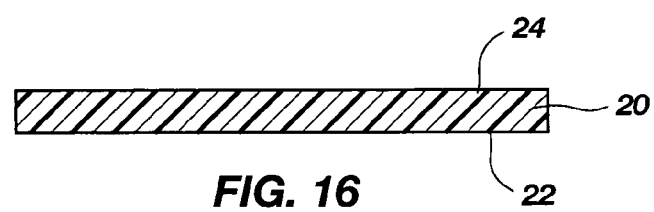
FIG. 16
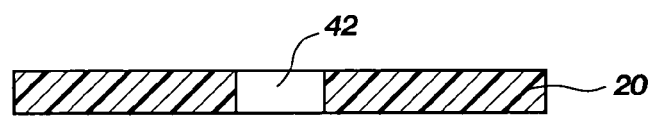
FIG. 17
FIG. 18
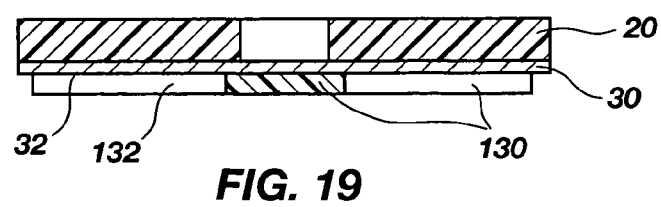
FIG. 19

TAPE SUBSTRATES WITH MOLD GATE SUPPORT STRUCTURES THAT ARE COPLANAR WITH CONDUCTIVE TRACES THEREOF AND ASSOCIATED METHODS

BACKGROUND OF THE INVENTION

1. Field of the Invention

The present invention relates generally to flexible substrates and, more specifically, to tape-based substrates that include copper layers. In particular, the present invention relates to tape-based substrates with mold gates that are configured so as to require only a single copper layer.

2. Background of Related Art

Numerous semiconductor packaging methodologies have found widespread use. Among those that have been commonly used is the so-called "board-on-chip" arrangement of a substrate relative to a semiconductor die. As its name implies, a substrate, or "board," which provides a connection pattern of input and output elements (e.g., contacts, leads, or other electrodes) is positioned on a semiconductor die. Typically, the substrate is positioned on the bond pad (i.e., input/output electrode) bearing surface, or "active" surface, of the semiconductor die.

In order to provide the desired connection pattern, a substrate typically includes a planar dielectric member, electrical contacts on the die-facing side of the substrate, conductive traces that extend laterally along the dielectric planar member, and redistributed contact pads, or "terminals," that are exposed at the opposite surface of the substrate. A substrate may also include conductive vias that extend through at least a portion of the thickness of the substrate to connect contacts to corresponding conductive traces.

In addition, to facilitate the formation of a molded protective structure, or "package," around the substrate-semiconductor die assembly, the substrate may also include a mold gate. A mold gate is a feature on the substrate which is configured to communicate with a mold runner through which liquid packaging material is introduced into a mold cavity and to direct the liquid packaging material to desired locations in a desired fashion.

Conventionally, when the substrate of a semiconductor device assembly is a so-called "two-layer flex" or "adhesiveless flex" tape-based substrate, or, more simply, a "tape substrate" 1, it will include a flexible dielectric film 2 (e.g., polyimide) and a layer of conductive traces 6, which are typically etched from a conductive (e.g., copper) film that was laminated to the polymeric film, that are carried upon a surface of the flexible dielectric film 2, as shown in FIG. 1A. At least one side, or surface 3, of tape substrate 1 carries conductive traces 6. Packaging, or encapsulating, material is typically introduced over surfaces of the tape substrate 1 and a semiconductor die thereon from the opposite side, or surface 4, of the tape substrate 1. As a result, the mold gate 5 is positioned on the opposite side, or surface 4, of the tape substrate 1 from that which carries the conductive traces 6.

Alternatively, as shown in FIG. 1B, when the substrate of a semiconductor device assembly is a so-called "three-layer flex" or "adhesive flex" tape substrate 1', it will include a flexible dielectric film 2, adhesive material 7 on at least one surface 3 of tape substrate 1', and conductive traces 6 that are secured to surface 3 by way of adhesive material 7.

As the dielectric film 2 is flexible, the mold gates 5 of tape substrates 1, 1' are typically formed by laminating an additional material layer to the surface 4 of the tape substrate 1, 1' which is opposite from the conductive trace-bearing surface 3 of the tape substrate 1, 1'. This additional material layer may be used to form the mold gate 5 itself, or to support a mold gate 5 which has been formed in the flexible dielectric film 2. Of course, the requirement that two material layers be laminated onto a flexible dielectric film 2 and, thus, separately patterned undesirably increases the cost of fabricating the tape substrate 1, 1'. Moreover, the use of an additional material layer to form a mold gate 5 may undesirably increase the thickness of the tape substrate 1, 1', which is counter to the trend toward semiconductor device packages of ever-decreasing dimensions.

Further, conventional tape-automated bonding (TAB) substrates, which include flexible dielectric films by which conductive traces and contacts, or terminals, are carried, are typically formed by mechanically punching the flexible dielectric film, laminating or adhesively securing a conductive film to a single surface of the flexible dielectric film, then patterning the conductive film to form conductive traces, contacts, and other conductive features. Because conventional tape substrates require that two conductive films be positioned on opposite surfaces of the flexible dielectric films thereof, many TAB substrate manufacturers are unable or unwilling to fabricate tape substrates.

Accordingly, there is a need for a mold gate configuration and mold gate fabrication methods which do not contribute to the thickness of a tape substrate of which the mold gate is a part or to the cost of fabricating the tape substrate.

SUMMARY OF THE INVENTION

The present invention, in an exemplary embodiment, includes a tape substrate with a flexible dielectric layer and a single conductive layer. A mold gate, which communicates with a surface of the flexible dielectric layer located opposite from that by which the single conductive layer is carried, is formed in the flexible dielectric layer. A support element of the mold gate, which has been formed from the single conductive layer, reinforces the mold gate.

In another embodiment, the present invention includes a mold gate for a tape substrate. The mold gate includes an aperture formed within a flexible dielectric film of the tape substrate. The mold gate also includes a support element that overlies at least a portion of the aperture and is formed from a single layer of conductive material, from which conductive traces of the tape substrate are also formed. Mold gates that incorporate teachings of the present invention may be used in conventional semiconductor device mold encapsulation processes.

The present invention also includes, in another embodiment, methods for forming the mold gate in a tape substrate. Such a method includes patterning a flexible dielectric film to include an aperture that communicates with an outer boundary of a tape substrate of which the flexible dielectric film is or is to be a part. A conductive film that is formed on or laminated to the polyimide film is patterned to form conductive structures, such as conductive traces, as well as to form the remaining support element of the mold gate.

In addition, in a further embodiment, methods for fabricating tape substrates are within the scope of the present invention. Such methods include, without being limited to the exemplary order given herein, providing a flexible dielectric film, forming desired features, including a mold gate, in the flexible dielectric layer, laminating a conductive film to a desired surface of the flexible dielectric film, and patterning the conductive film to form a support element of the mold gate, as well as conductive traces.

Systems and methods for assembling and encapsulating semiconductor device assemblies which include the tape substrates of the present invention are also within the scope of the invention.

Other features and advantages of the present invention will become apparent to those of ordinary skill in the art through consideration of the ensuing description, the accompanying drawings, and the appended claims.

BRIEF DESCRIPTION OF THE DRAWINGS

In the drawings, which depict various features of exemplary embodiments of the present invention:

FIGS. 4–7 are top views of exemplary configurations of mold gates according to the present invention;

FIGS. 8–13 are cross-sectional representations of a flexible dielectric film with a conductive layer laminated to a surface thereof depicting exemplary processing thereof to fabricate a tape substrate according to the present invention;

FIG. 15 is a side view of an exemplary mold gate that has been formed by the process shown in FIGS. 8–14;

FIGS. 16–19 are cross-sectional representations of a flexible dielectric film which illustrate another example of processing that may be employed to fabricate a tape substrate of the present invention;

FIG. 20 is a side view of a mold gate that has been formed by the process shown in FIGS. 16–19 and 11–14;

DETAILED DESCRIPTION

Figure 1A:
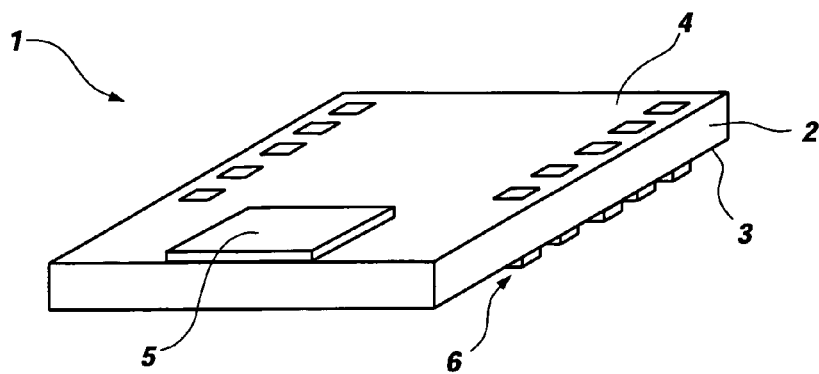
FIGS. 1A and 1B are perspective views of a conventional tape substrates.
Figure 1B:
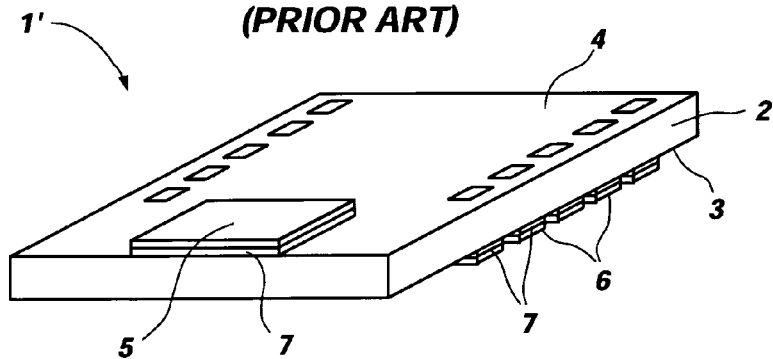
Figure 2:
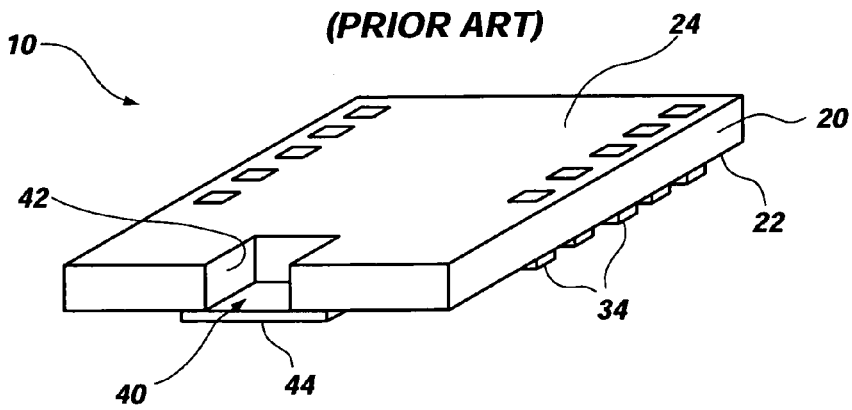
FIG. 2 is a perspective view of a tape substrate which includes a mold gate according to the present invention.
Figure 3:
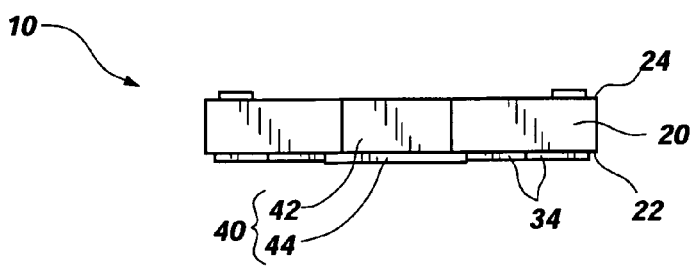
FIG. 3 is a side view of the tape substrate, including the mold gate thereof, shown in FIG. 2.

A tape substrate 10 that incorporates teachings of the present invention is shown in FIGS. 2 and 3. Tape substrate 10 includes a flexible dielectric film 20, conductive traces 34 that are carried by a surface 22 of the flexible dielectric film 20, and a mold gate 40. Mold gate 40 includes an aperture 42 formed in the flexible dielectric film 20 and a support element 44, which is substantially coplanar with, but electrically isolated from, conductive traces 34.

As shown, flexible dielectric film 20 is a substantially planar member which includes oppositely facing first and second surfaces 22 and 24, respectively. Flexible dielectric film 20 may be formed from any material which is suitable for use in so-called "carrier substrates," which are configured to carry conductive traces and other conductive structures, as well as electronic components, such as semiconductor devices, that include input/output elements that communicate with the conductive structures. By way of example only, flexible dielectric film 20 may be formed from polyimide (e.g., 50 μm thick polymide), which has gained wide acceptance in the semiconductor device industry for use as a carrier substrate material.

Conductive traces 34 may be secured to surface 22 nonadhesively (e.g., by lamination of the material thereof to surface 22), as in an adhesiveless flex substrate, or with a layer of adhesive material between conductive traces 34 and surface 22, as in an adhesive flex substrate.

Aperture 42 of mold gate 40 is located adjacent to the location of an outer boundary 12 (e.g., at or outside of outer boundary 12) (FIGS. 14 and 21) of tape substrate 10. In addition, aperture 42 opens to both surface 22 and surface 24 of flexible dielectric film 20. Support element 44 of mold gate 40 partially overlies and is secured to surface 22, which is the same surface by which conductive traces 34 are carried. Support element 44 is positioned so as to cover at least a portion of aperture 42 and forms a base of mold gate 40. The end of aperture 42 that opens to surface 24 remains uncovered so as to facilitate the introduction of liquid packaging material into aperture 42 and, thus, onto surface 24 of flexible dielectric film 20.

FIGS. 4–7 depict exemplary configurations of mold gates according to the present invention.

Mold gate 40' of FIG. 4 has a rectangular configuration. Mold gate 40", shown in FIG. 5, includes an enlarged opening 45" and a smaller interior 46", both of which are rectangular in shape. As shown, interior 46" may have a smaller width or a smaller height than opening 45".

FIG. 6 illustrates a mold gate 40''' with a Y shape, the opening 45''' thereof comprising a single channel, while the interior 46''' thereof, which is connected to opening 45''' at a junction 47''', includes two channels 46a''' and 46b''', between which a diversion dam 48''', or tap, which prevents packaging material from flowing onto bond wires or other intermediate conductive elements, is located.

Mold gate 40'''' of FIG. 7 includes an opening 45'''' which is rectangular in shape and which is narrower than the interior 46'''' thereof. The width of interior 46'''' tapers outwardly from its junction 47'''' with opening 45'''', imparting interior 46'''' with a somewhat triangular shape. Of course, other gate configurations are also within the scope of the present invention.

Turning now to FIGS. 8–14, an exemplary process for forming tape substrate 10 is depicted. The process which is shown in FIGS. 8-14 may be used to form tape substrate 10 from either a two-layer (adhesiveless flex) tape or a three-layer (adhesive flex) tape.

Figure 14:
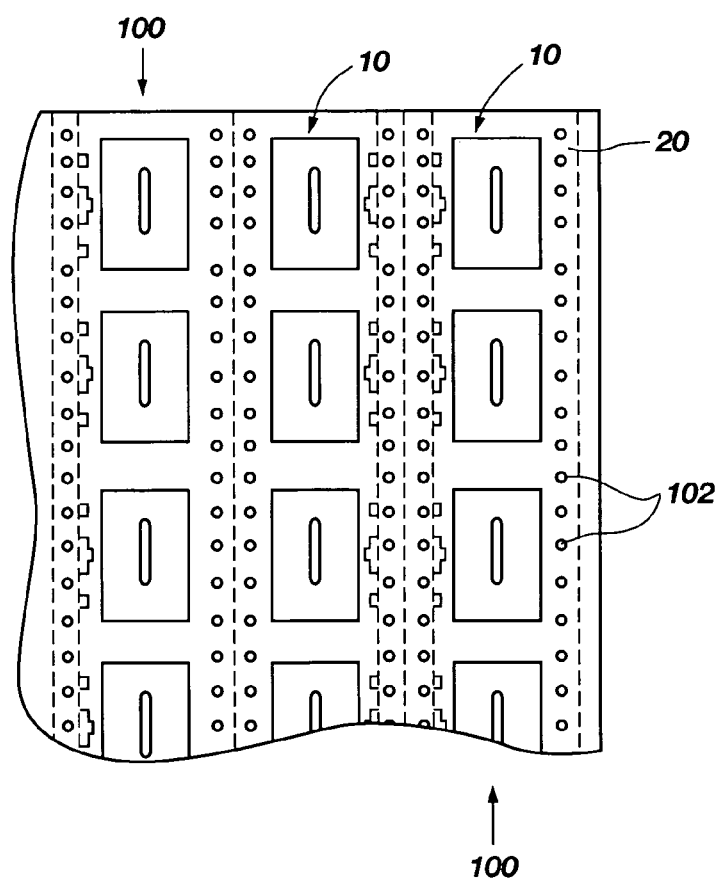
FIG. 14 is a schematic representation of a flexible dielectric film on which a plurality of tape substrates have been fabricated.

In FIG. 8, a flexible dielectric film 20 is provided with a conductive film 30 (e.g., an 18 μm thick copper film) laminated to a surface 22 thereof. Flexible dielectric film 20 may have dimensions that facilitate the fabrication of a plurality of strips 100 of multiple tape substrates 10 thereon (FIG. 14).

As shown in FIG. 9, masks 120, 130, such as photomasks, may be formed on one or both of surface 24 of flexible dielectric film 20 and an exposed surface 32 of conductive film 30, respectively. Mask 120 may include apertures 122 which are located and configured so as to expose regions of flexible dielectric film 20 within which apertures 42 of mold gate 40 (FIGS. 2 and 3) are to be formed. Mask 130 may likewise include apertures 132 which are located and configured to expose regions of conductive film 30 that are to be removed, such as those areas located between conductive traces 34 (FIGS. 2 and 3), as well as areas that are located laterally adjacent to the position where support element 44 of mold gate 40 is to be formed.

FIG. 10 depicts patterning of flexible dielectric film 20 through mask 120. In particular, an etchant or other chemical or mixture of chemicals (e.g., in a liquid or plasma state) that will remove the material of flexible dielectric film 20 at a faster rate than it will remove the material of conductive film 30 is permitted to contact regions of flexible dielectric film 20 that are exposed through apertures 122 of mask 120. The results are an aperture 42 of a mold gate (FIGS. 2 and 3), as well as other features, such as vias, slots, or other apertures.

FIG. 11 illustrates patterning of conductive film 30 through mask 130 to form conductive traces 34 and support element 44 of mold gate 40 (FIGS. 2 and 3). For example, an etchant or mixture of etchants (e.g., wet or dry, isotropic or anisotropic) suitable for removing the material of conductive film 30 at a faster rate than it removes the material of flexible dielectric film 20 may be permitted to contact regions of conductive film 30 that are exposed through apertures 132 of mask 130.

Following patterning of flexible dielectric film 20 and conductive film 30, masks 120 and 130 may be removed, or "stripped," as known in the art.

Figure 12:
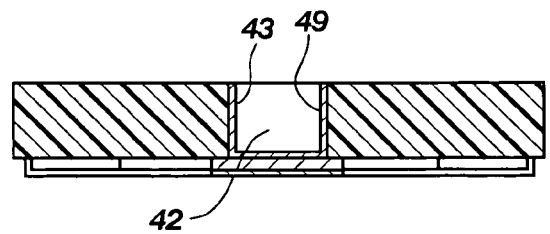

Thereafter, additional conductive features (not shown), may be formed by known processes. For example, the surfaces or sidewalls 43 of aperture 42 may be coated with a thin layer 49 of material (e.g., gold, platinum, palladium, nickel, silver, etc.) that will reduce or prevent adhesion of a packaging, or encapsulant, material to the material of flexible dielectric film 20. As desired, some or all of the conductive structures that are carried by flexible dielectric film 20 may also be plated with desired materials (e.g., a barrier layer, such as nickel, or a noble layer, such as gold), as known in the art (e.g., by use of electrolytic, electroless, or immersion plating processes), as shown in FIG. 12.

Figure 13:
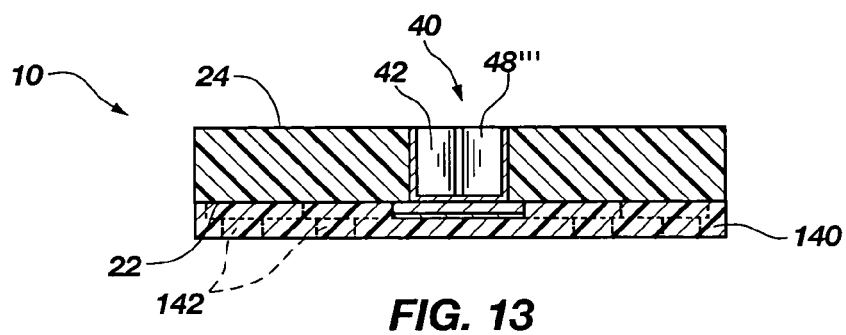

A solder mask 140 may then be applied or formed, as shown in FIG. 13, over one or both of surfaces 24 and 22 to facilitate the subsequent formation of solder balls or other conductive structures at desired locations of each tape substrate 10, i.e., those locations of tape substrate 10 that are exposed through apertures 142 of solder mask 140. Solder mask 140 (e.g., an AUS5 solder mask having a thickness of about 15 µm to about 35 µm) may be applied to or formed on surface 24, 22 by known processes.

If it is desired that a diversion dam (e.g., diversion dam 48''' of FIG. 6) be included in a mold gate 40, but the diversion dam was not formed while aperture 42 of mold gate 40 was being formed, diversion dam 48''' may be formed during the application or formation of solder mask 140. Diversion dam 48''' may be formed or applied over the same surface 22, 24 of flexible dielectric film 20 as that over which solder mask 140 is formed or applied, or over the opposite surface 24, 22 of flexible dielectric film 20.

Finally, as shown in FIG. 14, flexible dielectric film 20 may be singulated into a plurality of strips 100 of tape substrates 10, as known in the art. By way of example, known die cutting, or "mechanical punching," techniques may be used to form strips 100 from flexible dielectric film 20. Additionally, various features of strips 100, including, without limitation, transport apertures, or sprocket holes 102, thereof, may be formed either concurrently with or separately in time from the singulation of strips 100 from flexible dielectric film 20.

An exemplary mold gate 40 that may be formed by the process depicted in FIGS. 8–13 is shown in FIG. 15. As shown, aperture 42 of mold gate 40 includes sidewalls 43 which are tapered. Such tapering may be obtained by use of isotropic etch processes to form aperture 42 in flexible dielectric film 20. Of course, if anisotropic etch processes are employed, sidewalls 43' which are oriented substantially perpendicular to a plane of flexible dielectric film 20, such as those depicted in FIG. 20, may be formed.

With reference to FIGS. 16–19, as well as with returned reference to FIGS. 11–14, another exemplary embodiment of a process for fabricating a mold gate 40, as well as a tape substrate 10 which includes mold gate 40, is illustrated. The process shown in FIGS. 16–19 may be used to form tape substrates 10 from three-layer (adhesive flex) tapes, as conductive film 30 may be secured to flexible dielectric film 20 following the formation of an aperture 42 of mold gate 40 (FIGS. 2 and 3) therethrough.

FIG. 16 depicts a flexible dielectric film 20 with both oppositely facing surfaces 22 and 24 thereof being exposed.

As shown in FIG. 17, flexible dielectric film 20 may be patterned, such as by known die cutting, or "mechanical punching," techniques, to form vias, slots, other apertures, an aperture 42 of a mold gate 40 (FIGS. 2 and 3), or other features therein. In the depicted example, each of these features, including aperture 42, extends substantially through the thickness of flexible dielectric film 20.

Next, as shown in FIG. 18, a conductive film 30, such as a foil that comprises any conductive material that is suitable for use as the conductive traces of a carrier substrate (e.g., copper, aluminum, etc.), is laminated to surface 22 of flexible dielectric film 20. For example, conductive film 30 may be secured to surface 22 with a quantity of adhesive material 29, which may be applied to either surface 22 or to a surface 31 of conductive film 30 by known processes (e.g., by spraying, use of a roller, etc.).

Once conductive film 30 has been secured to flexible dielectric film 20, a mask 130, such as a photomask, may be applied to or formed over the exposed surface 32 of conductive film 30, as shown in FIG. 19. Regions of conductive film 30 that are to be removed during patterning thereof are exposed through apertures 132 of mask 130.

Process then continues as shown in and described with reference to FIGS. 11–14, wherein conductive film 30 is patterned (e.g., by etching) through mask 130 (FIG. 11), conductive features, such as conductive traces 34 and support element 44 are plated (FIG. 12), solder masks 140 are formed over surface 24 or surface 22 (FIG. 13), and strips 100 including multiple tape substrates 10 and their corresponding mold gates 40 are singulated from flexible dielectric film 20 (FIG. 14).

The result of such processes is the mold gate 40 shown in FIG. 20, which includes an aperture 42 with sidewalls 43' that are oriented substantially perpendicular to a plane of flexible dielectric film 20.

As the inventive processes described herein require that only one surface of a flexible dielectric film 20 have a conductive film 30 (FIGS. 8 and 18) laminated thereto, and since the die cutting processes that are typically employed by TAB substrate manufacturers may be used to form aperture 42 of mold gate 40, manufacturers of conventional TAB substrates are equipped to fabricate tape substrates 10 that incorporate teachings of the present invention.

Figure 21:
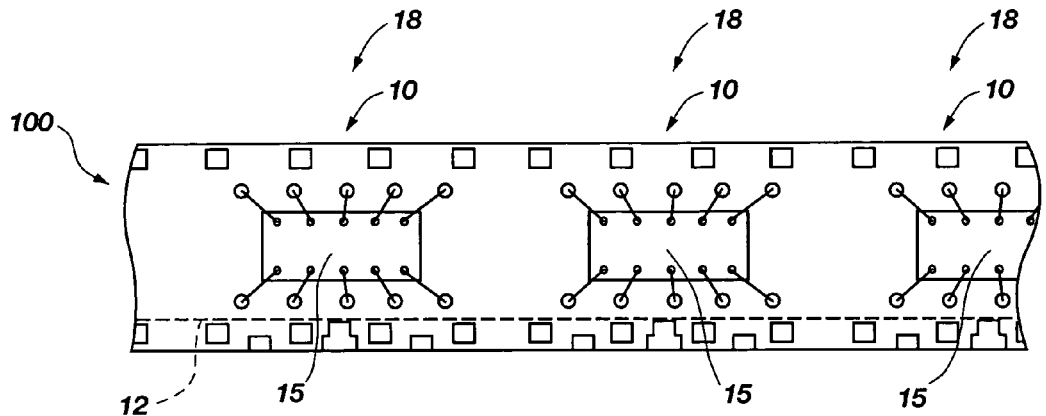
FIG. 21 depicts a strip including a plurality of tape substrates to which semiconductor dice have been secured and electrically connected.
Figure 22:
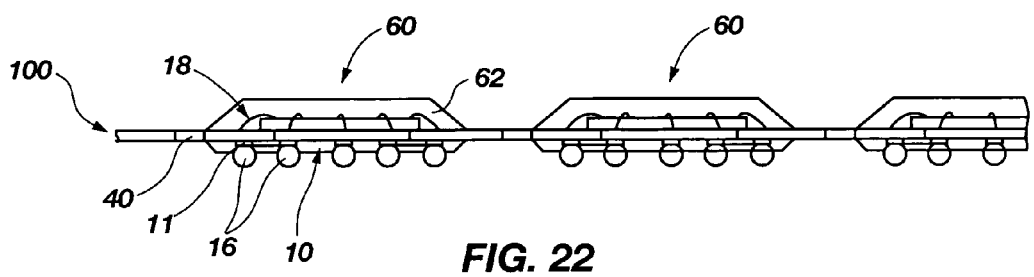
FIGS. 22 and 22A show the strip of FIG. 21 with package structures formed over each tape substrate-semiconductor die assembly.

Once strips 100 of tape substrates 10 according to the present invention have been formed, semiconductor dice 15 may be secured and electrically connected thereto, as known in the art and shown in FIGS. 21 and 22, to form semiconductor device assemblies 18. In addition, conductive structures 16 (FIG. 22), such as balls, bumps, pillars, or columns of conductive material (e.g., solder, another metal or metal alloy, conductive or conductor-filled elastomer, a dielectric film with anisotropically, or "z-axis," conductive elements therein, etc.) may be secured to contact pads 11 (FIG. 22) of tape substrates 10. Such processes may be effected as tape substrates 10 remain a part of a strip 100.

Figure 22A:
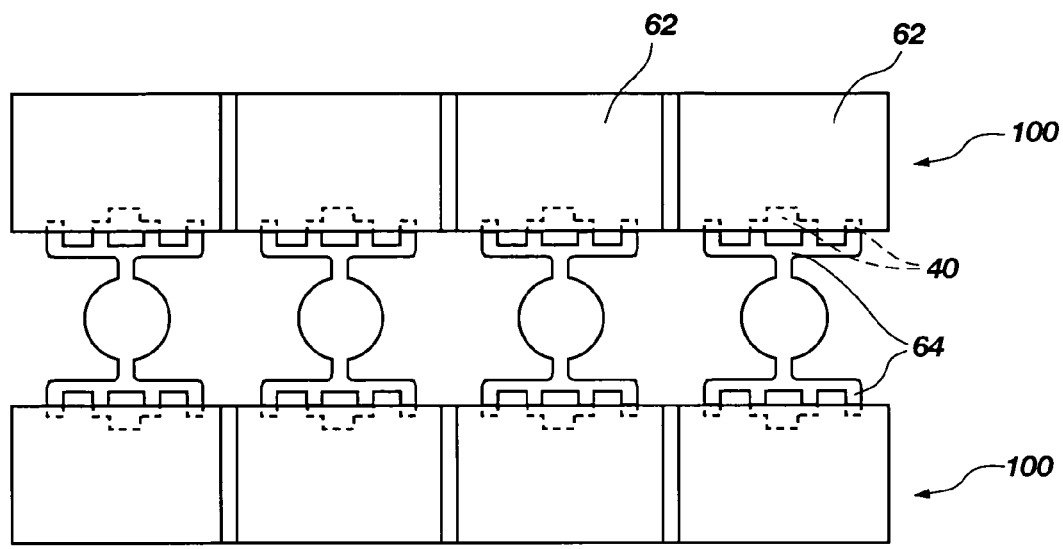

Thereafter, as illustrated in FIGS. 22 and 22A, molded package structures 62 may be formed around semiconductor device assemblies 18 that have been formed on each strip 100. In forming molded package structures 62, each semiconductor device assembly 18 may be disposed within a cavity of a mold (not shown), with mold gate 40 of each assembly in alignment with a corresponding mold runner, which is a channel that extends between and communicates with a source of mold material, or "pot," and the mold cavity within which the assembly is located. Of course, in order to effect such alignment, the mold may have to be specifically configured for use with strips 100 that bear tape substrates 10 according to the invention. A liquid packaging, or encapsulant, material is then introduced through each mold runner, into its corresponding mold cavity, through mold gate 40, and over the surfaces of tape substrate 10 and the semiconductor device that has been assembled therewith.

Figure 23:
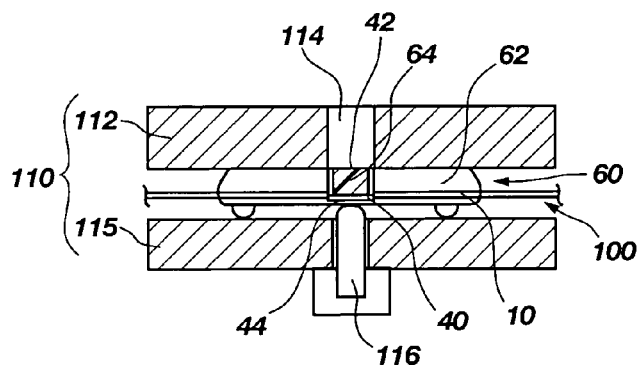
FIGS. 23 and 24 schematically depict a process for degating a packaged semiconductor device that includes a tape substrate according to the present invention.
Figure 24:
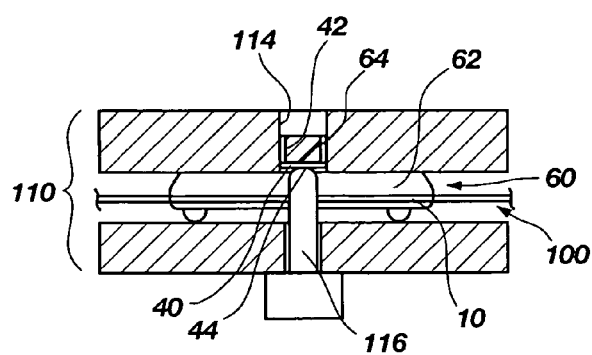

FIGS. 23 and 24 depict an exemplary process that may be used to remove a sprue 64, which is the resin from the mold runner that remains within a mold gate 40, as well as the support element 44 of mold gate 40, once the material of sprue 64 has sufficiently cured and prior to trimming portions of flexible dielectric film 20 that remain outside of a package structure 62 that has been molded over a tape substrate 10 (FIGS. 2 and 3) and a semiconductor die (not shown) secured and electrically connected thereto to form a packaged semiconductor device 60.

In FIG. 23, a strip 100 bearing a plurality of packaged semiconductor devices 60 (only one shown for clarity) is positioned within a degator 110. More specifically, strip 100 is positioned beneath an upper degator 112, or the upper degator 112 is positioned over strip 100, with sprues 64 being received within corresponding slots 114 of upper degator 112. Strip 100 is also positioned beneath a lower degator 115, or lower degator 115 is positioned beneath strip 100, such that an extendable punch 116 is located beneath each mold gate 40 and sprue 64.

As shown in FIG. 24, once strip 100 has been positioned within degator 110, each punch is extended toward and biased against support element 44 of its corresponding gate. As pressure is applied to support element 44, support element 44 and the sprue 64 resting thereon are forced through aperture 42 of mold gate 40 and into slot 114 of upper degator 112. Additionally, sprue 64 is broken free from the remainder of package structure 62. Of course, surfaces 43 (FIG. 13) of aperture 42 may be lined with a layer 49 (FIG. 13) of adhesion-reducing material, which effectively reduces the amount of force that need be applied to support element 44 to remove sprue 64 from aperture 42.

Once a first packaged semiconductor device 60 of strip 100 has been degated in this fashion, strip 100 may be moved (e.g., by indexing the same) to position another packaged semiconductor device 60 at the appropriate location between upper degator 112 and lower degator 115.

When all of the packaged semiconductor devices 60 on strip 100 have been degated, the semiconductor device packages 60 may then be separated from one another, as known in the art.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Moreover, features from different embodiments of the invention may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed:

1. A method for forming a mold gate of a tape substrate, comprising:
   forming an aperture of the mold gate in a flexible dielectric film of the tape substrate; and
   concurrently patterning conductive lines and a support structure of the mold gate from the same conductive film, the support structure at least partially overlapping the aperture.

2. The method of claim 1, further comprising: securing the conductive film to the flexible dielectric film.

3. The method of claim 2, wherein securing the conductive film is effected before forming an aperture of the mold gate.

4. The method of claim 3, wherein forming an aperture comprises etching the flexible dielectric film.

5. The method of claim 4, wherein etching the flexible dielectric film comprises at least one of wet etching and dry etching the flexible dielectric film.

6. The method of claim 2, wherein securing the conductive film is effected following forming an aperture of the mold gate.

7. The method of claim 6, wherein forming an aperture comprises mechanically removing material of the flexible dielectric film.

8. The method of claim 7, wherein mechanically removing material comprises die cutting the flexible dielectric film.

9. The method of claim 1, wherein concurrently patterning comprises:
   forming a mask over the conductive film; and
   removing material of the conductive film through apertures of the mask.

10. The method of claim 9, wherein removing material comprises etching the conductive film.

11. The method of claim 1, further comprising:
    coating sidewalls of the aperture with a material that reduces or prevents adhesion of a packaging material to the mold gate.

12. A method for fabricating a tape substrate, comprising:
    providing a flexible dielectric film;
    forming an aperture of a mold gate in the flexible dielectric film; and
    substantially concurrently forming a support element of them old gate and conductive traces from a single conductive film laminated onto a surface of the flexible dielectric films, the support element at least partially overlapping the aperture.

13. The method of claim 12, wherein providing the flexible dielectric film comprises providing the flexible dielectric film with the single conductive film prelaminated onto the surface thereof.

14. The method of claim 12, wherein providing the flexible dielectric film comprises providing the flexible dielectric film without the single conductive film on the surface thereof.

15. The method of claim 14, further comprising: laminating the single conductive film onto the surface of the flexible dielectric film.

16. The method of claim 15, wherein laminating is effected following forming the aperture.

17. The method of claim 16, wherein forming the aperture comprises mechanically forming the aperture.

18. The method of claim 17, wherein mechanically forming the aperture comprises die cutting the flexible dielectric film.

19. The method of claim 12, wherein forming the aperture comprises mechanically forming the aperture.

20. The method of claim 19, wherein mechanically forming the aperture comprises die cutting the flexible dielectric film.

21. The method of claim 12, wherein forming the aperture comprises:
    forming a mask on a surface of the flexible dielectric film; and
    removing material of the flexible dielectric film through apertures of the mask.

22. The method of claim 21 wherein removing comprises etching the material of the flexible dielectric film.

23. The method of claim 22, wherein etching comprises at least one of dry etching and wet etching the material of the flexible dielectric film.

24. The method of claim 12, wherein forming the aperture is effected at a location which is external to an outer boundary of an area of the flexible dielectric film where a finished tape substrate is to be located.

25. The method of claim 12, wherein substantially concurrently forming comprises:
    forming a mask over the single conductive film; and
    removing material of the single conductive film through apertures of the mask.

26. The method of claim 25, wherein removing material comprises etching the single conductive film.

27. The method of claim 12, further comprising:
    coating sidewalls of the aperture with a material that reduces or prevents adhesion of a packaging material to the mold gate.

28. The method of claim 12, further comprising plating conductive structures of the support element.

* * * * *

UNITED STATES PATENT AND TRADEMARK OFFICE
CERTIFICATE OF CORRECTION

| | | |
|---|---|---|
| PATENT NO. | : 7,057,297 B2 | Page 1 of 1 |
| APPLICATION NO. | : 10/788990 | |
| DATED | : June 6, 2006 | |
| INVENTOR(S) | : Teck Kheng Lee and M. Vijendran | |

It is certified that error appears in the above-identified patent and that said Letters Patent is hereby corrected as shown below:

CLAIM 12, COLUMN 8, LINE 56, change "them old gate" to --the mold gate--
CLAIM 12, COLUMN 8, LINE 58, change "dielectric films, the support element at least partially" to --dielectric film, the support structure at least partially--

Signed and Sealed this

Twenty-third Day of October, 2007

JON W. DUDAS
*Director of the United States Patent and Trademark Office*